United States Patent
Hartmann

(10) Patent No.: US 11,846,668 B2
(45) Date of Patent: Dec. 19, 2023

(54) METHOD FOR ASSESSING THE THERMAL LOADING OF A CONVERTER

(71) Applicant: SCHNEIDER ELECTRIC POWER DRIVES GMBH, Vienna (AT)

(72) Inventor: Michael Hartmann, Vienna (AT)

(73) Assignee: SCHNEIDER ELECTRIC POWER DRIVES GMBH, Vienna (AT)

( * ) Notice: Subject to any disclaimer, the term of this patent is extended or adjusted under 35 U.S.C. 154(b) by 162 days.

(21) Appl. No.: 17/438,046

(22) PCT Filed: Mar. 11, 2020

(86) PCT No.: PCT/EP2020/056506
§ 371 (c)(1),
(2) Date: Sep. 10, 2021

(87) PCT Pub. No.: WO2020/182885
PCT Pub. Date: Sep. 17, 2020

(65) Prior Publication Data
US 2022/0146568 A1 May 12, 2022

(30) Foreign Application Priority Data
Mar. 12, 2019 (AT) .................. 50208/2019

(51) Int. Cl.
*G01R 31/26* (2020.01)
*H01L 23/373* (2006.01)
*H01L 25/11* (2006.01)

(52) U.S. Cl.
CPC ...... *G01R 31/2642* (2013.01); *H01L 23/3735* (2013.01); *H01L 25/115* (2013.01)

(58) Field of Classification Search
CPC ........ G01K 3/10; G01K 1/12; G01R 31/2619; G01R 31/2628; G01R 31/2642;
(Continued)

(56) References Cited

U.S. PATENT DOCUMENTS

| 5,877,419 A | 3/1999 | Farokhzad |
| 9,194,376 B2 * | 11/2015 | Ritter ...................... F03D 17/00 |
| 9,869,722 B1 * | 1/2018 | Morris ............... G01R 31/2849 |

(Continued)

FOREIGN PATENT DOCUMENTS

| CN | 105891698 | 8/2016 |
| CN | 108603913 | 9/2018 |

(Continued)

OTHER PUBLICATIONS

International Search Report issued in International Patent Application No. PCT/EP2020/056506, dated Jun. 26, 2020, along with an English translation thereof.

(Continued)

*Primary Examiner* — Vinh P Nguyen
(74) *Attorney, Agent, or Firm* — GREENBLUM & BERNSTEIN, P.L.C.

(57) ABSTRACT

A method for assessing the state of damage of a semiconductor module that is subject to operational loading, in particular a semiconductor module of a drive system converter, that includes at least one semiconductor component arranged on or in a support structure. It is possible not only to estimate a spent service life for the entire semiconductor module, but also to detect unexpected or undesirable loading states and thus a premature reduction of the remaining service life of the semiconductor module. Continuous load assessments are thus possible already during the operation of the semiconductor module and allow interventions to be made in good time.

15 Claims, 2 Drawing Sheets

Figure 1:
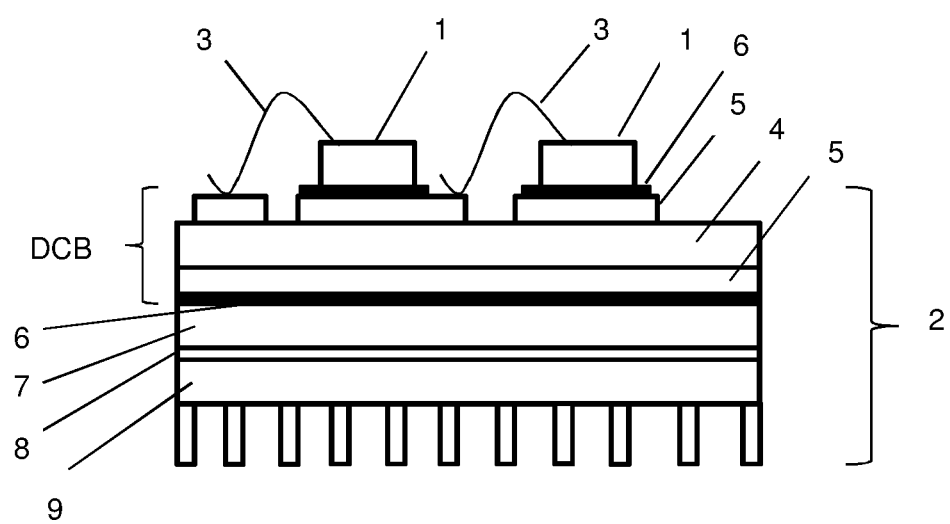

(58) Field of Classification Search
CPC ............ G01R 31/2817; G01R 31/2849; G01R 31/2875; G01R 31/42; G01R 31/00; H01L 23/3735; H01L 25/115; H02M 5/00; G06F 11/00; G01D 1/00
See application file for complete search history.

(56) References Cited

U.S. PATENT DOCUMENTS 10,365,320 B2 * 7/2019 Takehara ............ G01R 31/2608
11,480,607 B2 * 10/2022 Dietz ................ G01R 31/2619

FOREIGN PATENT DOCUMENTS

| CN | 108885231 | 11/2018 |
|---|---|---|
| CN | 109143012 | 1/2019 |
| DE | 102 03 577 | 8/2003 |
| DE | 10 2009 032 063 | 1/2011 |
| DE | 10 2011 087 764 | 6/2013 |
| DE | 10 2013 102 829 | 9/2014 |
| DE | 10 2013 221 587 | 4/2015 |
| DE | 10 2014 206 621 | 10/2015 |
| JP | 2012202801 | 10/2012 |

OTHER PUBLICATIONS

Written Opinion of the International Search Authority issued in International Patent Application No. PCT/EP2020/056506, dated Jun. 26, 2020, along with an English translation thereof.
China Office Action conducted in counterpart China Appln. No. 202080020153.6 (Jun. 29, 2023).

* cited by examiner

METHOD FOR ASSESSING THE THERMAL LOADING OF A CONVERTER

The invention relates to a method for assessing the damage state of a semiconductor assembly that is subject to operational loading, in particular a drive system converter, having at least one semiconductor component arranged on or in a support structure, wherein a temperature occurring within the semiconductor component is determined in the form of a time series as a high-cycle load-time curve, to which a first damage characteristic value $LC_{PC}$ is assigned with the aid of assessment algorithms known per se, and a temperature occurring in the support structure is determined in the form of a time series as a low-cycle load-time curve to which a second damage characteristic value $LC_{TC}$ is assigned with the aid of the assessment algorithms known per se, according to the preamble of claim 1.

Semiconductor components in classical design contain one or more differently doped regions to achieve their function, for example as diodes or transistors. During their operation, power dissipation occurs, which leads to a heating of the semiconductor component, which is usually quantified with the help of the junction temperature of the respective semiconductor component. In the following, however, semiconductor components are not only understood as individual components such as diodes or transistors, but also as combinations of a plurality of electrically connected semiconductor components in the form of integrated circuits. Such semiconductor components are also referred to as "dies". These dies are held on or in a support structure which manages the current conduction to the semiconductor component and absorbs and dissipates heat emitted by the semiconductor component. The arrangement of semiconductor component and support structure is referred to in the following as a semiconductor assembly. An example of such a support assembly is printed circuit boards, on which the semiconductor components are usually mounted and electrically contacted in the form of housed dies. Another example of a possible support structure are DCB (direct copper bonded) substrates on which the semiconductor components are mostly attached in the form of bare dies and connected with bond wires. Furthermore, especially for the production of power modules, embedding technologies are known in which semiconductor components such as MOSFETs or IGBTs are embedded in the support structure (e.g. "$p^2$ packs"). The support structure usually has a base plate which is provided with a heat sink to dissipate the heat present in the support structure.

During operation of semiconductor components, problems arise in many applications due to heat generation from conduction and switching losses, which place thermal load on the semiconductor component and support structure. This thermal load can reduce the life of the semiconductor component and even lead to failure of the respective semiconductor component. One example is drive system converters for motors or generators. The thermal loads on a semiconductor component depend on the one hand on the operating conditions under which the respective semiconductor component is operated, and on the other hand on the design of the semiconductor component itself.

Since these thermal loads can reduce the service life of the semiconductor assembly, the question of the probability of failure and thus the operational reliability of the semiconductor assembly therefore arises. In this context, it would be desirable to have methods for assessing the thermal damage state of an operationally loaded semiconductor assembly which allow conclusions to be drawn about the consumed service life of the semiconductor assembly. With the help of such methods, maintenance intervals could be optimized. Another possible use of such methods would be the detection of undesired or unexpected load conditions on the part of the manufacturer, e.g. as a result of an unsuitable load on the part of the user or as a result of an incorrect design of the semiconductor components. Ideally, the user receives feedback on the thermal damage state already during operation, in order to be able to take precautions at an early stage for longer, fail-safe operation of the semiconductor assembly, for example by changing the operating parameters or replacing the respective semiconductor assembly. To a specific extent, the damage state represents the integral of past and current thermal loads on the semiconductor assembly.

The requirements for the operational reliability of semiconductor assemblies are sometimes very high. In aviation, for example, a failure safety of 24 years with 100,000 flight hours is usually specified. In the automotive industry, 15 years with 10,000 operating hours, which corresponds to a mileage of around 300,000 km, is generally specified. For industrial drives, the specifications for fail-safe operating time are usually 5-20 years or 60,000 operating hours under full load. Known methods for assessing the remaining service life of a semiconductor assembly are mostly based on counters that, for example, select the number of switch-on and switch-off operations or the operating time and compare them with specified values in order to estimate a remaining service life. However, the number of switch-on and switch-off operations or the operating time allow only limited conclusions to be drawn about the actual thermal load of a semiconductor assembly and therefore provide only unreliable results.

Therefore, semiconductor component manufacturers have attempted to determine the service life of semiconductor components based on stress tests, and to provide the user with the information obtained from the stress tests regarding the expected service life of a semiconductor component. For example, the junction temperatures achieved in such tests can be related to the expected service life of the respective semiconductor component. The higher the junction temperature during operation, the shorter the service life will be. However, this approach presupposes that the loads in the course of the stress tests on the part of the manufacturer are comparable with the actual operational loads by the user, which, however, is mostly not the case. In fact, semiconductor assemblies are sometimes operated under completely different operating conditions than expected by the manufacturer.

In addition, the problem arises that not only the semiconductor component is at risk of failure, but also the support structure of the semiconductor assembly. Since semiconductor assemblies are made of materials with different thermal properties, especially different coefficients of thermal expansion, mechanical stress conditions may occur due to the time-varying stress. Consequently, cyclic thermal loading can cause mechanical damage, such as film delamination, terminal detachment, or fatigue fractures. These stresses must therefore also be taken into account in an evaluation of the thermal load state of an operationally loaded semiconductor assembly in order to obtain a reliable estimate of the remaining service life.

It is therefore the object of the invention to provide methods for assessing the damage state of an operationally loaded semiconductor assembly, which not only allow the damage state to be assessed for the entire semiconductor assembly, but are also sufficiently accurate to also detect unexpected or undesired load states and thus a premature reduction in the remaining service life of the semiconductor assembly. In this regard, these methods are intended to enable ongoing load evaluations while the semiconductor assembly is still in operation. These objects are achieved by the features of claim 1.

Claim 1 relates to a method for assessing the damage state of an operationally loaded semiconductor assembly, in particular a drive system converter, having at least one semiconductor component arranged on or in a support structure, wherein a temperature $T_j$ occurring within the semiconductor component is determined in the form of a time series as a high-cycle load-time curve, to which a first damage characteristic value $LC_{PC}$ is assigned with the aid of assessment algorithms known per se, and a temperature $T_C$ occurring in the support structure is determined in the form of a time series as a low-cycle load-time curve to which a second damage characteristic value $LC_{TC}$ is assigned with the aid of the assessment algorithms known per se. According to the invention, it is proposed here that the first damage characteristic value $LC_{PC}$ for identifying a high-cycle actual operating state range of the semiconductor assembly is assigned to a non-critical, a critical, and a supercritical operating condition range for high-cycle loads of the semiconductor component by comparing the first damage characteristic value $LC_{PC}$ with a predetermined first reference value $LC_{PC,ref}$, and the second damage characteristic value $LC_{TC}$ for identifying a low-cycle actual operating condition range of the semiconductor component is assigned to a non-critical, a critical and a supercritical operating condition range for low-cycle stresses of the semiconductor component by comparing the second damage characteristic value $LC_{TC}$ with a predetermined second reference value $LC_{TC,ref}$, and subsequently a first indication signal is generated if both the high-cycle and the low-cycle actual operating condition ranges correspond to a non-critical operating condition range, a second indication signal is generated if the high-cycle or the low-cycle actual operating condition range corresponds to a critical operating condition range and both do not correspond to a supercritical operating condition range, and a second indication signal is generated if the high cycle or the low cycle actual operating condition range does not correspond to a supercritical operating condition range, and a third indication signal is generated if the high-cycle or the low-cycle actual operating condition range corresponds to a supercritical operating condition range, wherein the time curve of the first reference value ($LC_{PC,ref}$) and of the second reference value ($LC_{TC,ref}$) during operation of the semiconductor assembly is in each case a predetermined, monotonically increasing function which assumes the value 1 when the maximum service life is reached, and the determination of the first damage characteristic value ($LC_{PC}$) during operation of the converter is often repeated at predetermined time intervals on the basis of currently determined high-cycle load-time curves and compared with the first reference value ($LC_{PC,ref}$), and the determination of the second damage characteristic value ($LC_{TC}$) during operation of the converter is often repeated at predetermined time intervals on the basis of currently determined low-cycle load-time curves and compared with the second reference value ($LC_{TC,ref}$) in order to generate an indication signal for the current load state in each case.

According to the invention, a distinction is thus made between accumulated damage due to high-cycle and low-cycle loads for the purpose of assessing the damage state of the semiconductor assembly due to thermal loads, which is also referred to below as the thermal damage state. In each case, these are time-varying thermal loads whose oscillation cycles—also referred to as load cycles in the following—proceed at different rates, with the oscillation cycles of the high-cycle loads proceeding more rapidly than those of the low-cycle loads. The concept of characterizing oscillation cycles and deriving damage parameters was developed intrinsically in materials science, where materials are subjected to a vibrating load and their fatigue is evaluated. In this context, materials are subjected to cyclic loading, for example, in fatigue tests in tension and/or compression, which are also referred to as vibration cycles. Cyclic loads with high load cycles are referred to as high-cycle fatigue, and cyclic loads with low load cycles as low-cycle fatigue. In this case, it has been observed that static-mechanical characteristic values of a material such as yield strength or tensile strength are of little or only limited use for strength calculations. Instead, cyclic strength data must be considered, which are determined in so-called Wöhler tests and graphically represented in Wöhler diagrams as Wöhler curves. Furthermore, models have been developed in materials science from which service life equations are derived that allow the service life of the component to be calculated on the basis of cyclic strength data, mostly in terms of the number of oscillation cycles. These models are usually based on Wöhler curves and describe them using a power approach. The Coffin-Manson model, for example, which is well-known in materials science, establishes a relationship between the plastic strain and the service life, wherein the plastic strain is provided with an exponent and a coefficient, both of which can be determined experimentally or by simulation.

According to the invention, these concepts of materials science are transferred to the evaluation of thermal damage of semiconductor assemblies, wherein, of course, no oscillation cycles of mechanical oscillations of the semiconductor assembly are considered, but oscillation cycles of the temperature. According to the invention, the oscillation cycles of a temperature occurring within the semiconductor component and a temperature occurring in the support structure are also used. The temperature occurring within the semiconductor component is usually a junction temperature, and the temperature occurring in the support structure is, for example, a temperature measured at the base plate of the support structure.

First, the temperature $T_j$ occurring within the semiconductor component will be discussed, which will generally be a junction temperature and will also be referred to as the "internal" temperature $T_j$ in the following. This internal temperature $T_j$ is primarily based on the power dissipation due to an electric current flowing through the semiconductor element. Since the loads on the semiconductor component usually vary with time with the current period and, in the case of drive system converters, also with the motor speed, the junction temperature, for example, and thus the temperature load on the entire semiconductor component also shows a time dependence. During the electrical load, the internal temperature $T_j$ increases and reaches a maximum temperature $T_{j,max}$ at the end of the electrical load. The internal temperature $T_j$ will subsequently decrease again and reaches a minimum value $T_{j,min}$ before the start of the new load. The difference is the temperature rise $\Delta T_j$. Furthermore, an average value $T_{j,m}$ can also be formed. The number of load cycles will be denoted by $N_j$ in the following, wherein the maximum number of load cycles until failure of the semiconductor component will be denoted as $N_{j,f}$. The temperature rise $\Delta T_j$ and the average value $T_{j,m}$ can be determined during the operation of the semiconductor component. From these values, the maximum number $N_{j,f}$ can be derived, for which different and in itself known mathematical models are available, as will be explained in more detail. From this maximum number $N_{j,f}$ a first damage characteristic value $LC_{PC}$ can be derived, which characterizes the used service life of the semiconductor component, as will also be explained in more detail. Failure of the semiconductor component can be caused, for example, by damage to the semiconductor itself, but also by detachment of the bond wires, or by damage to the solder joints of the die on the support structure.

In the following, the temperature $T_C$ occurring outside the semiconductor component in the support structure will be discussed, which will be referred to as the "external" temperature $T_C$ in the following. Semiconductor components are usually attached to or in the support structure in such a way that the heat transfer from the semiconductor component to the support structure is optimized in order to efficiently dissipate heat and supply it to a heat sink, for example. This also results in heating of the support structure, which is characterized according to the invention by means of an external temperature $T_C$ occurring in the support structure, for example by means of a temperature $T_C$ measured at the base plate of the support structure. This external temperature $T_C$ of the support structure also exhibits a cyclic curve which, however, is characterized by slower changes compared to the internal temperature $T_j$ of the semiconductor component due to higher thermal capacities of the structure. Nevertheless, a maximum value $T_{C,max}$ a minimum value $T_{C,min}$, a temperature rise $\Delta TC$ and an average temperature $T_{C,m}$ can also be determined for the external temperature $T_C$. The number of load cycles for the support structure will be denoted $N_C$ in the following, wherein the maximum number of load cycles until failure of the support structure is denoted $N_{C,f}$. The temperature rise $\Delta TC$ and the average value $T_{C,m}$ can be determined during operation of the semiconductor component. From these values, the maximum number of load cycles $N_{C,f}$ can be derived, for which, as already mentioned, various mathematical models known per se are available, as will be explained in more detail. From this maximum number $N_{C,f}$ a second damage characteristic value $LC_{TC}$ can be derived, which characterizes the used service life of the support structure, as will also be explained in more detail. Failure of the support structure can be caused, for example, by damage to the solder joints within the support structure or by damage to the thermal interface between the support structure and the heat sink.

According to the invention, the first damage characteristic value $LC_{PC}$ for identifying a high-cycle actual operating state range of the semiconductor assembly is assigned to a non-critical, a critical and a supercritical operating state range for high-cycle loads of the semiconductor assembly, and the second damage characteristic value $LC_{TC}$ for identifying a low-cycle actual operating state range of the semiconductor assembly is assigned to a non-critical, a critical and a supercritical operating state range for low-cycle loads of the semiconductor assembly.

Subsequently, a criterion is required on the basis of which the evaluation and indication of a damage state of the semiconductor assembly is performed. According to the invention, it is proposed for this purpose that a first indication signal is generated if both the high-cycle and the low-cycle actual operating state ranges correspond to a non-critical operating state range, a second indication signal is generated if the high-cycle or low-cycle actual operating condition range corresponds to a critical operating condition range and neither corresponds to a supercritical operating condition range, and a third indication signal is generated if the high-cycle or low-cycle actual operating condition range corresponds to a supercritical operating condition range. This criterion thus provides that it is always the higher of the high-cycle and the low-cycle actual operating condition range that determines the assessment of the load condition and the indication signal. The first indication signal can be a green light signal, the second indication signal can be a yellow light signal and the third indication signal can be a red light signal.

Preferably, the assignment to a non-critical, a critical and a supercritical operating condition range is made by comparing the first damage characteristic value $LC_{PC}$ with a predetermined first reference value $LC_{PC,ref}$ and the second damage characteristic value $LC_{TC}$ with a predetermined second reference value $LC_{TC,ref}$ wherein a non-critical operating state range is present in each case if the respective damage characteristic value $LC_{PC}$, $LC_{TC}$ lies below a deviation range of the reference value $LC_{PC,ref}$, $LC_{TC,ref}$ assigned to it in each case, a critical operating state range is present in each case if the damage characteristic value $LC_{PC}$, $LC_{TC}$ lies within the deviation range of the reference value $LC_{PC,ref}$, $LC_{TC,ref}$ assigned to it in each case, and a supercritical operating state range is present in each case if the damage characteristic value $LC_{PC}$, $LC_{TC}$ lies above the deviation range of the reference value $LC_{PC,ref}$, $LC_{TC,ref}$ assigned to it in each case. The deviation range of the reference values $LC_{PC,ref}$, $LC_{TC,ref}$ can, for example, lie in the value range of 80-100% of the reference values $LC_{PC,ref}$, $LC_{TC,ref}$. A non-critical operating condition range would exist in this case if, for example, the first damage characteristic value $LC_{PC}$ is less than 80% of the first reference value $LC_{PC,ref}$. A critical operating condition range would be present if the first damage characteristic value $LC_{PC}$ is within the deviation range of 80-100% of the first reference value $LC_{PC,ref}$. A supercritical operating condition range would be present if the first damage characteristic value $LC_{PC}$ is above the first reference value $LC_{PC,ref}$. The latter represents an unexpectedly high load on the semiconductor component, which the user should know about in order to be able to intervene in an appropriate way. It is understood that the non-critical, critical and supercritical operating condition ranges can also be selected in the form of other percentage deviations for the deviation range. In addition, different percentage deviations could be selected in each case for high-cycle and low-cycle loads to define the non-critical, critical and supercritical operating condition ranges.

Subsequently, preferred methods for determining the damage characteristics $LC_{PC}$, $LC_{TC}$ and the reference values $LC_{PC,ref}$, $LC_{TC,ref}$ are proposed.

For the determination of the first damage characteristic value $LC_{PC}$, it is preferably proposed that the assessment algorithms comprise a rainflow counting performed on the basis of the high-cycle load-time curve, by means of which the frequency of a temperature rise $\Delta T_j$ of a specific order of magnitude is counted for different orders of magnitude for the temperature $T_j$ occurring within the semiconductor component, as well as a computational determination of the maximum number of load cycles $N_{j,f}$ for a temperature rise $\Delta T_j$ of each order of magnitude, wherein the first damage characteristic value $LC_{PC}$ is the sum of the quotients of the frequency of a temperature rise $\Delta T_j$ of a specific order of magnitude for the temperature $T_j$ occurring within the semiconductor component to the maximum number of load cycles $N_{j,f}$ for a temperature rise $\Delta T_j$ of the same order of magnitude. By means of rainflow counting, individual oscillation cycles (closed hysteresis loops) of a load-time curve are separated and their frequency is counted, for which suitable software is available. The proposed method of rainflow counting has been shown to be very robust with respect to the sampling rate of the load-time curve to be analyzed and, in the context of the present invention, provides a matrix in which the corresponding frequency of occurrence is given for different orders of magnitude of the temperature rise $\Delta T_j$. The orders of magnitude may also be referred to as classes to which a determined temperature rise $\Delta T_j$ is assigned. The summation of the quotients mentioned is a modification of the procedure known as "Miner's Rule". It is assumed that each load cycle causes a cumulative damage, wherein a smaller temperature rise $\Delta T_j$ causes a comparatively smaller damage than a larger temperature rise $\Delta T_j$. If the frequency of a particular temperature rise $\Delta T_j$ is set in relation to the calculated maximum number of load cycles $N_{j,f}$ for the respective temperature rise $\Delta T_j$, a characteristic value for the consumption of service life is obtained. The sum of this consumption for each order of magnitude of the temperature rise $\Delta T_j$ results in the first damage characteristic value $LC_{PC}$, which increases steadily during operation of the semiconductor assembly and assumes the value 1 when the maximum service life is reached.

For the computational determination of the maximum number of load cycles $N_{j,f}$ for the temperature rise $\Delta T_j$ of a particular order of magnitude, it is proposed that an average value $T_{j,m}$ for the temperature $T_j$ occurring within the semiconductor component for the respective order of magnitude is first determined from the temperature rise $\Delta T_j$ of a particular order of magnitude for the temperature $T_j$ occurring within the semiconductor component, and the computational determination of the maximum number of load cycles $N_{j,f}$ for the temperature rise $\Delta T_j$ of each order of magnitude is calculated according to the following formula:

$$N_{j,f} = A \cdot \Delta T_j^\alpha \cdot \exp(c/(k_B \cdot T_{j,m}))$$

wherein A, c and α are parameters determined empirically or by simulation for the respective semiconductor component and $k_B = 1.38 \cdot 10^{-23}$ J/K.

The proposed formula is the already mentioned Coffin-Manson model with respect to the term $A \cdot \Delta T_j^\alpha$, but according to the proposed model it has been extended by an exponential function containing an activation energy c and the Boltzmann constant $k_B$. Using the given formula, for given values of the temperature rise $\Delta T$ and the average value $T_m$, for each order of magnitude of the temperature rise $\Delta T$, a maximum number of load cycles $N_{j,f}$ can be calculated for high-cycle loads until failure of the semiconductor assembly occurs. The average value $T_m$ is determined for a known temperature rise $\Delta T$ using the formula $$T_m = T_{min} + (T_{max} - T_{min})/2$$

For the determination of the first reference value $LC_{PC,ref}$ for the first damage characteristic value $LC_{PC}$, an analogous procedure can be followed, wherein, however, an expected high-cycle reference load-time curve is used and, on the basis of the expected high-cycle reference load-time curve, a rainflow count is carried out, by means of which the frequency of a temperature rise $\Delta T_{j,ref}$ of a specific order of magnitude is counted for different orders of magnitude for the temperature $T_{j,ref}$ occurring within the semiconductor component, as well as a computational determination of the maximum number of load cycles $N_{j,f,ref}$ for a temperature rise $\Delta T_{j,ref}$ of each order of magnitude, wherein the first reference value $LC_{PC,ref}$ is the sum of the quotients of the frequency of a temperature rise $\Delta T_{j,ref}$ of a specific order of magnitude for the temperature $T_{j,ref}$ occurring within the semiconductor component to the maximum number of load cycles $N_{j,f,ref}$ for a temperature rise $\Delta T_{j,ref}$ of the same order of magnitude. In order to determine the maximum number of load cycles $N_{j,f,ref}$ for the temperature rise of each order of magnitude, in turn, an average value $T_{j,m,ref}$ for the temperature $T_{j,ref}$ occurring within the semiconductor component for the respective order of magnitude can first be determined from the temperature rise $\Delta T_{j,ref}$ of a specific order of magnitude for the temperature $T_{j,ref}$ occurring within the semiconductor component, and the computational determination of the maximum number of load cycles $N_{j,f,ref}$ for the temperature rise $\Delta T_{j,ref}$ of each order of magnitude can be calculated in accordance with the following formula:

$$N_{j,f,ref} = A \cdot \Delta T_{j,ref}^\alpha \cdot \exp(c/(k_B \cdot T_{j,m,ref}))$$

wherein A, c and α are parameters determined empirically or by simulation for the respective semiconductor assembly and $k_B = 1.38 \cdot 10^{-23}$ J/K.

This determination of the first reference value $LC_{PC,ref}$ will only be carried out once for a specific application, and usually by the manufacturer of the drive system converter. Considering the temporal course of the reference value $LC_{PC,ref}$ during the operation of the semiconductor assembly, a monotonously increasing function results, which assumes the value 1 when the maximum service life is reached, and which is stored in the memory of a microprocessor of the converter. The determination of the first damage characteristic value $LC_{PC}$, on the other hand, is often repeated at predetermined time intervals during operation of the converter on the basis of currently determined high-cycle load-time curves and compared with the first reference value $LC_{PC,ref}$ in order to generate an indication signal for the current load state. Considering the time curve of the first damage characteristic value $LC_{PC}$ during operation of the semiconductor assembly also results in a monotonically increasing function, which assumes the value 1 when the maximum service life is reached, but which can be steeper or flatter than that of the first reference value $LC_{PC,ref}$. If it is steeper, the corresponding converter is loaded more than expected, so that an early failure of the semiconductor assembly is to be expected. If it is flatter, the corresponding converter is loaded less than expected, so that safe operation of the semiconductor assembly up to the expected maximum service life can be expected.

For the determination of the second damage characteristic value $LC_{TC}$, an analogous procedure is proposed in that the assessment algorithms comprise a rainflow counting carried out on the basis of the low-cycle load-time curve, by means of which the frequency of a temperature rise $\Delta T_C$ of a specific order of magnitude is counted for different orders of magnitude for the temperature $T_C$ occurring in the support structure, as well as a computational determination of the maximum number of load cycles $N_{C,f}$ for a temperature rise $\Delta T_C$ of each order of magnitude, wherein the second damage characteristic value $LC_{TC}$ is the sum of the quotients of the frequency of a temperature rise $\Delta T_C$ of a specific order of magnitude for the temperature $T_C$ occurring in the support structure to the maximum number of load cycles $N_{C,f}$ for a temperature rise $\Delta T_C$ of the same order of magnitude.

In order to determine the maximum number of load cycles $N_{C,f}$ for the temperature rise $\Delta T_C$ of each order of magnitude, an average value $T_{C,m}$ for the temperature $T_C$ occurring in the support structure for the respective order of magnitude can in turn first be determined from the temperature rise $\Delta T_C$ of a particular order of magnitude for the temperature $T_C$ occurring in the support structure, and the computational determination of the maximum number of load cycles $N_{C,f}$ for the temperature rise $\Delta T_C$ of each order of magnitude can be calculated according to the following formula:

$$N_{C,f}=B \cdot \Delta T_C^\beta \cdot \exp(d/(k_B \cdot T_{C,m}))$$

wherein B, d and ß are parameters determined empirically or by simulation for the respective semiconductor assembly and $k_B=1.38 \cdot 10^{-23}$ J/K.

To determine the second reference value $LC_{TC,ref}$ for the second damage characteristic value $LC_{TC}$, an analogous procedure to the first reference value $LC_{PC,ref}$ can be followed, in which case, however, an expected low-cycle reference load-time curve is used, and a rainflow counting is carried out on the basis of the expected low-cycle reference load-time curve, by means of which, for the temperature $T_{C,ref}$ occurring in the support structure, the frequency of a temperature rise $\Delta T_{C,ref}$ of a specific order of magnitude is counted for different orders of magnitude, and a computational determination of the maximum number of load cycles $N_{C,f,ref}$ for a temperature rise $\Delta T_{C,ref}$ of each order of magnitude, wherein the second reference value $LC_{TC,ref}$ is the sum of the quotients of the frequency of temperature rise $\Delta T_{C,ref}$ of a specific order of magnitude for the temperature $T_{C,ref}$ occurring in the support structure to the maximum number of load cycles $N_{C,f,ref}$ for a temperature rise $\Delta T_{C,ref}$ of the same order of magnitude.

To determine the maximum number of load cycles $N_{C,f,ref}$ for the temperature rise $\Delta_{TC,ref}$ of each order of magnitude, an average value $T_{C,m,ref}$ for the temperature $T_{C,ref}$ occurring in the support structure can in turn be determined from the temperature rise $\Delta T_{C,ref}$ of a particular order of magnitude for the temperature $T_{C,ref}$ occurring in the support structure for the respective order of magnitude, and the computational determination of the maximum number of load cycles $N_{C,f,ref}$ for the temperature rise $\Delta T_{C,ref}$ of each order of magnitude can be calculated in accordance with the following formula:

$$N_{C,f,ref}=B \cdot \Delta T_{C,ref}^\beta \cdot \exp(d/(k_B \cdot T_{C,m,ref}))$$

wherein B, d and ß are parameters determined empirically or by simulation for the respective semiconductor assembly and $k_B=1.38 \cdot 10^{-23}$ J/K.

This determination of the second reference value $LC_{TC,ref}$ will again only be carried out once for a specific application, and usually by the manufacturer of the drive system converter. Considering the time curve of the second reference value $LC_{TC,ref}$ during the operation of the semiconductor assembly again results in a monotonously increasing function, which assumes the value 1 when the maximum service life is reached, and which is stored in the memory of a microprocessor of the converter. The determination of the second damage characteristic value $LC_{TC}$, on the other hand, is often repeated at predetermined time intervals during operation of the converter on the basis of currently determined low-cycle load-time curves and compared with the second reference value $LC_{TC,ref}$ in order to generate an indication signal for the current damage state. Considering the time curve of the second damage characteristic value $LC_{TC}$ during the operation of the semiconductor assembly also results in a monotonically increasing function, which assumes the value 1 when the maximum service life is reached, but which can be steeper or flatter than that of the second reference value $LC_{TC,ref}$. If it is steeper, the corresponding converter is loaded more than expected, so that an early failure of the semiconductor assembly is to be expected. If it is below the reference curve, the corresponding converter is loaded less than expected, so that a safe operation of the semiconductor assembly up to the expected maximum service life can be expected.

Figure 2:
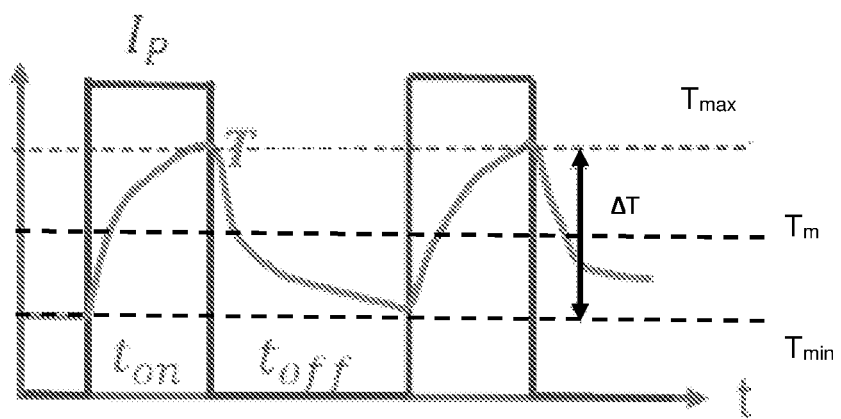
Figure 3:
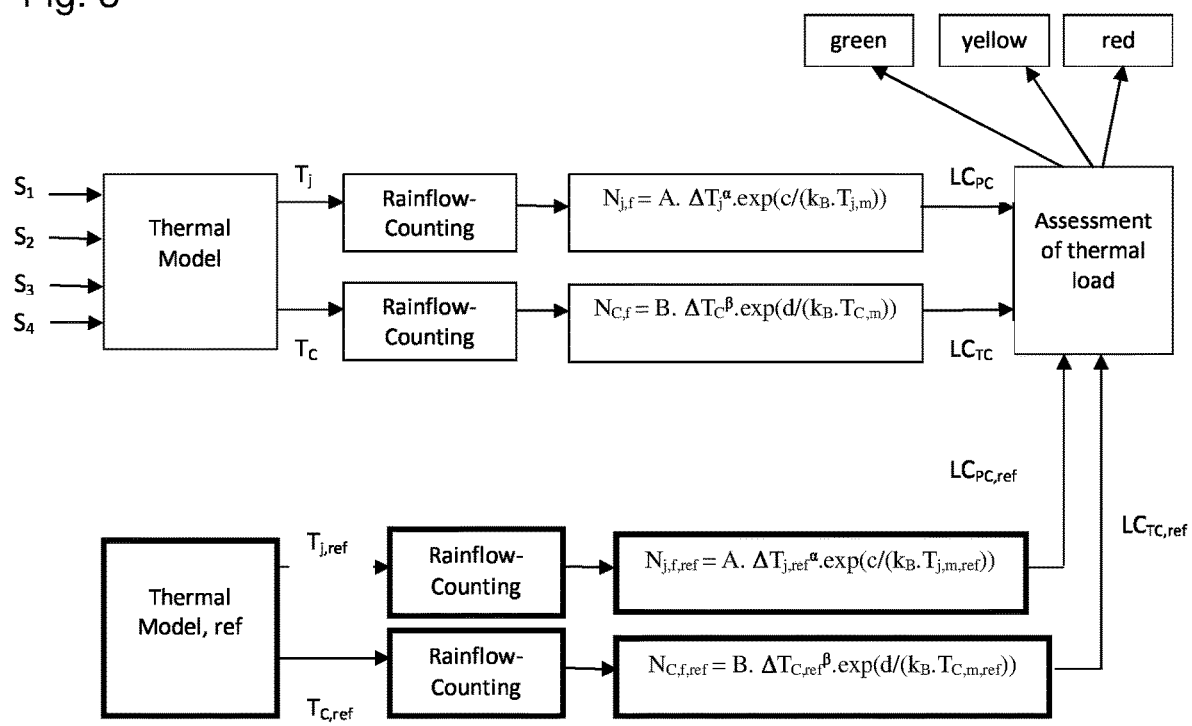

The invention is explained in more detail below by means of exemplary embodiments with the aid of the accompanying figures, wherein:

FIG. 1 shows a schematic representation of a possible embodiment of a semiconductor assembly, FIG. 2 shows a schematic diagram illustrating the load cycles in the course of thermal loading of semiconductor components and support structure during operation of the semiconductor assembly, and FIG. 3 shows a block diagram illustrating an embodiment of the method according to the invention.

Firstly, reference is made to FIG. 1, which shows a schematic representation of a possible embodiment of a semiconductor assembly comprising a semiconductor component 1 and a support structure 2. In the exemplary embodiment shown, the support structure 2 comprises a DCB substrate on which the semiconductor components 1 are mounted in the form of bare dies and connected with bond wires 3. DCB substrates consist of a ceramic insulator 4, for example aluminum oxide or aluminum nitride, to which a copper coating 5 is applied in a high-temperature melting and diffusion process and bonded firmly to the ceramic insulator 4. DCB substrates exhibit high current-carrying capacity due to the thick copper metallization and are especially popular in high-power semiconductor assemblies. The semiconductor components 1 are attached to the copper coating 5 on one side of the ceramic insulator 4 via solder joints 6. On the side opposite to the semiconductor components 1, a base plate 7 is attached to the copper coating 5 of the ceramic insulator 4 via further solder joints 6, which is connected to a heat sink 9 via a thermal interface 8. As can be seen from the structure according to FIG. 1, semiconductor assemblies are made of materials with different thermal properties, in particular different coefficients of thermal expansion. Therefore, due to the time-varying load, mechanical stress conditions may occur that load the semiconductor assembly. Consequently, cyclic thermal load may cause mechanical damage, such as film delamination, terminal detachment, or fatigue fractures. Failure of the semiconductor component 1 may be caused, for example, by damage to the semiconductor itself, but also by detachment of the bond wires 3, or by damage to the solder joints 6 of the semiconductor component 1 on the support structure 2. Failure of the support structure 2 may be caused, for example, by damage to the solder joints 6 within the support structure or by damage to the thermal interface 8 between the base plate 7 and the heat sink 9.

The thermal loads on the semiconductor assembly show a periodicity over time during operation due to the changes in the electrical load $I_P$ overtime and, in the case of a drive system converter, also due to the speed of the machine. These thermal load cycles are explained with reference to FIG. 2. During the electrical load ("$t_{on}$"), the temperature T increases and reaches a maximum temperature $T_{max}$ when the electrical load ends. The temperature T will subsequently decrease again ("$t_{off}$") and reach a minimum value $T_{min}$ before the start of the new load. The difference is the temperature rise $\Delta T$. Furthermore, an average value $T_m$ can also be formed.

In the context of the present invention, these load cycles are considered for two different temperatures at which changes occur at different rates, namely in the form of comparatively rapidly changing high-cycle load-time curves for a temperature $T_j$ occurring within the semiconductor component 1 and in the form of comparatively slowly changing low-cycle load-time curves for a temperature $T_C$ occurring in the support structure 2. The temperature $T_j$ occurring within the semiconductor component 1 is usually a junction temperature, and the temperature $T_C$ occurring in the support structure 2 is, for example, a temperature measured at the base plate 7 of the support structure 2.

The temperature $T_C$ measured at the base plate 7 of the support structure 2 can easily be measured and specified in the form of low-cycle load-time curves, as shown in simplified form in FIG. 2. However, actual load-time curves are more complex in structure and show, for example, a superposition of several load cycles, each with a different temperature rise and different periods.

The junction temperature as a temperature $T_j$ occurring within the semiconductor component 1 is not accessible to direct temperature measurement. However, a temperature that is as representative as possible of the junction temperature can be measured elsewhere in order to be able to draw conclusions about the junction temperature. For this purpose, the user can rely on different thermal models. For example, detailed thermal models exist which are recalculated with the switching frequency, i.e. with an update rate of several kHz. Simplified thermal models with lower update rates are also available, which admittedly also have lower accuracies.

Another possibility was described in AT 518.115 of the applicant. In a first step, a power dissipation averaged over the current period is calculated from circuit parameters $S_i$ (i=1, 2 . . . N), and an average value of the thermal load averaged over the current period is determined from the power dissipation with the aid of known thermal simulation models. In a second step, a correction value for the average value of the thermal load averaged over the current period to a maximum value of the thermal load during the current period is determined from predetermined interpolation functions for the circuit parameters $S_i$, wherein the maximum value of the thermal load is the sum or product of the average value of the thermal load averaged over the current period and the correction value. The power dissipation can be determined from the circuit parameters $S_i$, which are essentially independent of time over a current period. To create the interpolation functions mentioned, the maximum deviation of the thermal load from the average value can be calculated point by point with the aid of thermal simulation models known per se for combinations of circuit parameters $S_i$ to be expected, and a correction value can be determined by comparison with the average value, wherein selected correction values for selected combinations of the circuit parameters $S_i$ are the supporting points of the interpolation functions. With the help of this method, on the one hand, the accuracy of thermal simulation models known per se can be maintained as far as possible, wherein the need for high computing power during operation of the circuit is avoided, however. Instead, during operation of the circuit, only the power dissipation has to be calculated from essentially time-independent average values of the circuit parameters $S_i$, and subsequently an average value of the thermal load, which are comparatively simple computational operations. For a sufficiently accurate estimation of the thermal load, however, the above-mentioned alternating loads must also be taken into account. In the proposed methodology, these alternating loads are recorded with the aid of interpolation functions which have been determined beforehand (offline) for each circuit parameter $S_i$ relevant for the alternating load and are stored for each semiconductor component in a memory unit of a corresponding processor, which is usually provided in power circuits anyway. However, the alternating load is not tracked in its time dependence, but only a correction value for calculating the maximum value is determined on the basis of an average value, in that the maximum (positive) deviation of the thermal load from the average value is calculated point by point with the aid of thermal simulation models known per se for combinations of circuit parameters $S_i$ to be expected and is made available in libraries as supporting values of an interpolation function. During operation of the circuit, the correction value for calculating the maximum value is determined for specific circuit parameters $S_i$ with the aid of these interpolation functions. This process can also be carried out comparatively quickly and without a great deal of computing power during operation of the circuit. Due to the low computational effort during the operation of the circuit, it is also possible with the help of the proposed methodology to determine the thermal load of each semiconductor component 1 also during operation many times.

The result of these calculations can be represented in highly cyclic load-time curves, as shown in simplified form in FIG. 2. It is understood that actual load-time curves are more complex in design and show, for example, a superposition of several load cycles, each with a different temperature range and different periods.

The high-cycle load-time curve determined in this way for a temperature $T_j$ occurring inside the semiconductor component 1 and the low-cycle load-time curve for a temperature $T_C$ occurring in the support structure 2 are the starting point of the method according to the invention, as will be explained below with reference to FIG. 3. The determination of the high-cycle and low-cycle load-time curves takes place in the first block of FIG. 3 labeled "Thermal model".

These load-time curves are each subjected to rainflow counting. In the case of the highly cyclic load-time curve, the frequency of a temperature rise $\Delta T_j$ of a specific order of magnitude is counted for different orders of magnitude by means of rainflow counting for the temperature $T_j$ occurring within the semiconductor component. The result is a matrix in which different orders of magnitude are assigned a corresponding frequency for the temperature rise $\Delta T_j$. The highly cyclic load-time curves are determined and analyzed at predetermined intervals during operation of the semiconductor assembly, wherein the frequencies of a temperature rise $\Delta T_j$ of a specific magnitude are summed up over time. The frequencies determined in this way can be set in relation to the maximum number of load cycles $N_{j,f}$ for a temperature rise $\Delta T_j$ of a specific magnitude. This quotient, which can be determined for each order of magnitude, can subsequently be summed up over all orders of magnitude and results in a value which will be small at the beginning of the operation of the semiconductor assembly and will approach the value 1 during the service life of the semiconductor assembly. This value is the first damage characteristic value $LC_{PC}$.

For the computational determination of the maximum number of load cycles $N_{j,f}$ for the temperature rise $\Delta T_j$ of a specific order of magnitude, an average value $T_{j,m}$ for the temperature $T_j$ occurring within the semiconductor component for the respective order of magnitude can first be determined from the temperature rise $\Delta T_j$ of a specific order of magnitude for the temperature $T_j$ occurring within the semiconductor component. The computational determination of the maximum number of load cycles $N_{j,f}$ for the temperature rise $\Delta T_j$ of each order of magnitude can subsequently be calculated according to the following formula:

$$N_{j,f} = A \cdot \Delta T_j^\alpha \cdot \exp(c/(k_B \cdot T_{j,m}))$$

wherein A, c and α are parameters determined empirically or by simulation for the respective semiconductor assembly and $k_B=1.38 \cdot 10^{-23}$ J/K.

An analogous procedure can be followed for the low-cycle load-time curve. In the case of the low-cycle load-time curve, the frequency of a temperature rise $\Delta T_C$ of a specific order of magnitude is counted for different orders of magnitude by means of rainflow counting for the temperature $T_C$ of the base plate 7. The result is again a matrix where different orders of magnitude are assigned a corresponding frequency for the temperature rise $\Delta T_C$. The low-cycle load-time curves are determined and analyzed at predetermined intervals during operation of the semiconductor assembly, wherein the frequencies of a temperature rise $\Delta T_C$ of a specific magnitude are summed up over time. The frequencies determined in this way can be set in relation to the maximum number of load cycles $N_{C,f}$ for a temperature rise $\Delta T_C$ of a specific magnitude. This quotient, which can be determined for each order of magnitude, can subsequently be summed up over all orders of magnitude and results in a value that will be small at the beginning of the operation of the semiconductor assembly and will approach the value 1 during the service life of the semiconductor assembly. This value is the second damage characteristic value $LC_{TC}$.

For the computational determination of the maximum number of load cycles $N_{C,f}$ for the temperature rise $\Delta T_C$ of a specific order of magnitude, an average value $T_{C,m}$, can first be determined for the relevant order of magnitude from the temperature rise $\Delta T_C$ of a specific order of magnitude for the temperature $T_C$ of the base plate 7. The computational determination of the maximum number of load cycles $N_{C,f}$ for the temperature rise $\Delta T_C$ of each order of magnitude can subsequently be calculated according to the following formula:

$$N_{C,f} = B \cdot \Delta T_C^{\beta} \cdot \exp(d/(k_B \cdot T_{C,m}))$$

wherein B, d and ß are parameters determined empirically or by simulation for the respective semiconductor assembly and $k_B=1.38 \cdot 10^{-23}$ J/K.

The first reference value $LC_{PC,ref}$ and the second reference value $LC_{TC,ref}$ are determined in the same way as the first damage characteristic value $LC_{PC}$ and the second damage characteristic value $LC_{TC}$, as shown in the lower part of FIG. 3 with the blocks outlined in bold. Only an expected high-cycle or low-cycle reference load-time curve is used, and a rainflow count is performed based on the expected high-cycle or low-cycle reference load-time curve. Furthermore, the determination of the first reference value $LC_{PC,ref}$ and the second reference value $LC_{TC,ref}$ will only be carried out once for a specific application, usually by the manufacturer of the drive system converter. Considering the temporal course of the reference values $LC_{PC,ref}$ and $LC_{TC,ref}$ during the operation of the semiconductor assembly, a monotonously increasing function results in each case, which assumes the value 1 when the maximum service life is reached, and which is stored in the memory of a microprocessor of the converter. The determination of the first damage characteristic value $LC_{PC}$ and the second damage characteristic value $LC_{TC}$, on the other hand, is often repeated at predetermined time intervals during operation of the converter on the basis of currently determined load-time curves and compared with the first reference value $LC_{PC,ref}$ and the second reference value $LC_{TC,ref}$ to generate an indication signal for the current load state. Taking into account the time curve of the first damage characteristic value $LC_{PC}$ and the second damage characteristic value $LC_{TC}$ during operation of the semiconductor assembly, a monotonically increasing function results in each case, which assumes the value 1 when the maximum service life is reached, but which can be steeper or flatter than that of the corresponding reference values $LC_{PC,ref}$, $LC_{TC,ref}$. If it is steeper, the corresponding converter is loaded more than expected, so that an early failure of the semiconductor assembly is to be expected. If it is flatter, the corresponding converter is loaded less than expected, so that safe operation of the semiconductor assembly up to the expected maximum service life can be expected.

In this case, the absolute value can be compared, or the time derivative, which corresponds to the increase of the mentioned monotonic functions. Both the absolute value and the time derivative are suitable for comparing the first and second damage characteristic values $LC_{PC}$, $LC_{TC}$ with the respective reference values $LC_{PC,ref}$, $LC_{TC,ref}$.

On the basis of this comparison, assignment to a non-critical, a critical and a supercritical operating state range is made by comparing the first damage characteristic value $LC_{PC}$ with the first reference value $LC_{PC,ref}$ and the second damage characteristic value $LC_{TC}$ with the second reference value $LC_{TC,ref}$, wherein a non-critical operating state range is present in each case if the respective damage characteristic value $LC_{PC}$, $LC_{TC}$ lies below a deviation range of the reference value $LC_{PC,ref}$, $LC_{TC,ref}$ assigned to it in each case. A critical operating state range is present in each case if the damage characteristic value $LC_{PC}$, $LC_{TC}$ lies within the deviation range of the reference value $LC_{PC,ref}$, $LC_{TC,ref}$ assigned to it in each case, and a supercritical operating state range is present in each case if the damage characteristic value $LC_{PC}$, $LC_{TC}$ lies above the deviation range of the reference value $LC_{PC,ref}$, $LC_{TC,ref}$ assigned to it in each case. The deviation range of the reference values $LC_{TC,ref}$, $LC_{TC,ref}$ can, for example, lie in the value range of 80-100% of the reference values $LC_{PC,ref}$, $LC_{TC,ref}$. A non-critical operating condition range would exist in this case if, for example, the first damage characteristic value $LC_{PC}$ is less than 80% of the first reference value $LC_{PC,ref}$. A critical operating condition range would be present if the first damage characteristic value $LC_{PC}$ is within the deviation range of 80-100% of the first reference value $LC_{PC,ref}$. A supercritical operating condition range would be present if the first damage characteristic value $LC_{PC}$ is above the first reference value $LC_{PC,ref}$. The latter represents an unexpectedly high load on the semiconductor component, which the user should know about in order to be able to intervene in an appropriate way. It is understood that the non-critical, critical and supercritical operating condition ranges can also be selected in the form of other percentage deviations for the deviation range. In addition, different percentage deviations could be selected in each case for high-cycle and low-cycle loads to define the non-critical, critical and supercritical operating condition ranges.

With the aid of the invention, it is thus possible to evaluate the thermal damage state of an operationally loaded semiconductor assembly, wherein it is not only possible to estimate a consumed service life for the entire semiconductor assembly, but also to detect unexpected or undesired load conditions and thus a premature reduction of the remaining service life of the semiconductor assembly. This enables ongoing load evaluations while the semiconductor assembly is still in operation, allowing timely interventions.

The invention claimed is:

1. A method for assessing the damage state of an operationally loaded semiconductor assembly having at least one semiconductor component arranged on or in a support structure, comprising:

determining a temperature ($T_j$) occurring within the semiconductor component in the form of a time series as a high-cycle load-time curve, to which a first damage characteristic value ($LC_{PC}$) is assigned with an aid of assessment algorithms, determining a temperature (Tc) occurring in the support structure in the form of a time series as a low-cyclic load-time curve, to which a second damage characteristic value ($LC_{TC}$) is assigned with the aid of the assessment algorithms, wherein the high-cycle load-time curve and the low-cyclic load-time curve are time-varying thermal loads whose oscillation cycles proceed at different rates, with the oscillation cycles of the high-cycle loads proceeding more rapidly than those of the low-cycle loads, for identifying a high-cycle actual operating state range of the semiconductor assembly, assigning to the first damage characteristic value ($LC_{PC}$) a non-critical, a critical and a supercritical operating state range for high-cycle loads on the semiconductor assembly by comparing the first damage characteristic value ($LC_{PC}$) with a predetermined first reference value ($LC_{PC,ref}$) and for identifying a low-cycle actual operating state range of the semiconductor assembly, assigning to the second damage characteristic value ($LC_{TC}$) a non-critical, a critical and a supercritical operating state range for low-cycle loads of the semiconductor assembly by comparing the second damage characteristic value ($LC_{TC}$) with a predetermined second reference value ($LC_{TC,ref}$), generating a first indication signal to indicate when both the high-cycle and the low-cycle actual operating state ranges correspond to a non-critical operating state range, generating a second indication signal to indicate when the high-cycle or the low-cycle actual operating state range corresponds to a critical operating state range and neither corresponds to a supercritical operating state range, or generating a third indication signal to indicate when the high-cycle or the low-cycle actual operating state range corresponds to a supercritical operating state range, wherein the time curve of the first reference value ($LC_{PC,ref}$) and of the second reference value ($LC_{TC,ref}$) during operation of the semiconductor assembly is in each case a predetermined, monotonically increasing function which assumes the value 1 when the maximum service life is reached, and wherein the method further comprises:

repeating at predetermined intervals the determination of the first damage characteristic value ($LC_{PC}$) during operation of the semiconductor assembly on the basis of currently determined high-cycle load-time curves and compared with the first reference value ($LC_{PC,ref}$), and repeating at predetermined intervals the determination of the second damage characteristic value ($LC_{TC}$) during operation of the semiconductor assembly on the basis of currently determined low-cycle load-time curves and compared with the second reference value ($LC_{TC,ref}$) to generate in each case an indication signal to indicate the current load state.

2. The method according to claim 1, wherein a non-critical operating state range is present in each case when the damage characteristic value ($LC_{PC}$, $LC_{TC}$) lies below a deviation range of the assigned reference value ($LC_{PC,ref}$, $LC_{TC,ref}$), a critical operating state range is present in each case when the damage characteristic value ($LC_{PC}$, $LC_{TC}$) lies within the deviation range of the assigned reference value ($LC_{PC,ref}$, $LC_{TC,ref}$), and a supercritical operating state range is present in each case when the damage characteristic value ($LC_{PC}$, $LC_{TC}$) lies above the deviation range of the assigned reference value ($LC_{PC,ref}$, $LC_{TC,ref}$).

3. The method according to claim 2, wherein the deviation range of the reference values ($LC_{PC,ref}$, $LC_{TC,ref}$) is in the value range of 80-100% of the reference values ($LC_{PC,ref}$, $LC_{TC,ref}$).

4. The method according to claim 1, wherein the assessment algorithms comprise a rainflow count carried out on a basis of the high-cycle load-time curve, by which a frequency of a temperature rise ($\Delta T_j$) of a specific order of magnitude is counted for different orders of magnitude for the temperature ($T_j$) occurring within the semiconductor component, and a computational determination of a maximum number of load cycles ($N_{j,f}$) for a temperature rise ($\Delta T_j$) of each order of magnitude, wherein the first damage characteristic value ($LC_{PC}$) is a sum of the quotients of the frequency of a temperature rise ($\Delta T_j$) of a specific order of magnitude for the temperature ($T_j$) occurring within the semiconductor component to the maximum number of load cycles ($N_{j,f}$) for a temperature rise ($\Delta T_j$) of a same order of magnitude.

5. The method according to claim 4, wherein an average value ($T_{j,m}$) for the temperature ($T_j$) occurring within the semiconductor component is determined from the temperature rise ($\Delta T_j$) of a specific order of magnitude for the temperature ($T_j$) occurring within the semiconductor component for the respective order of magnitude, and the computational determination of the maximum number of load cycles ($N_{j,f}$) for the temperature rise ($\Delta T_j$) of each order of magnitude is calculated according to the following formula:

$$N_{j,f} = A \cdot \Delta T_j^\alpha \cdot \exp(c/(k_B \cdot T_{j,m}))$$

wherein A, c and $\alpha$ are parameters determined empirically or by simulation for the respective semiconductor assembly and $k_B = 1.38 \cdot 10^{-23}$ J/K.

6. The method according to claim 1, wherein a rainflow count is carried out on a basis of an expected high-cycle reference load-time curve, by which a frequency of a temperature rise ($\Delta T_{j,ref}$) of a specific order of magnitude is counted for different orders of magnitude for the temperature ($T_{j,ref}$) occurring within the semiconductor component, and a computational determination of a maximum number of load cycles ($N_{j,f,ref}$) for a temperature rise ($\Delta T_{j,ref}$) of each order of magnitude, wherein the first reference value ($LC_{PC,ref}$) is a sum of the quotients of the frequency of a temperature rise ($\Delta T_{j,ref}$) of a specific order of magnitude for the temperature ($T_{j,ref}$) occurring within the semiconductor component to the maximum number of load cycles ($N_{j,f,ref}$) for a temperature rise ($\Delta T_{j,ref}$) of a same order of magnitude.

7. The method according to claim 6, wherein an average value ($T_{j,m,ref}$) for the temperature ($T_{j,ref}$) occurring within the semiconductor component is determined from the temperature rise ($\Delta T_{j,ref}$) of a specific order of magnitude for the temperature ($T_{j,ref}$) occurring within the semiconductor component for the respective order of magnitude, and the computational determination of the maximum number of load cycles ($N_{j,f,ref}$) for the temperature rise ($\Delta T_{j,ref}$) of each order of magnitude is calculated according to the following formula:

$$N_{j,f,ref} = A \cdot \Delta T_{j,ref}^{\alpha} \cdot \exp(c/(k_B \cdot T_{j,m,ref}))$$

wherein A, c and α are parameters determined empirically or by simulation for the respective semiconductor assembly and $k_B = 1.38 \cdot 10^{-23}$ J/K.

8. The method according to claim 1, wherein the assessment algorithms comprise a rainflow count carried out on a basis of the low-cycle load-time curve, by which a frequency of a temperature rise ($\Delta Tc$) of a specific order of magnitude is counted for different orders of magnitude for the temperature (Tc) occurring in the support structure, and a computational determination of a maximum number of load cycles ($N_{c,f}$) for a temperature rise ($\Delta T_C$) of each order of magnitude, wherein the second damage characteristic value ($LC_{TC}$) is a sum of quotients of the frequency of a temperature rise ($\Delta T_C$) of a specific order of magnitude for the temperature (Tc) occurring in the support structure to the maximum number of load cycles ($N_{c,f}$) for a temperature rise ($\Delta T_C$) of a same order of magnitude.

9. The method according to claim 8, wherein an average value ($T_{C,m}$) for the temperature ($T_C$) occurring in the support structure is determined from the temperature rise ($\Delta T_C$) of a specific order of magnitude for the temperature ($T_C$) occurring in the support structure for the respective order of magnitude, and the computational determination of the maximum number of load cycles ($N_{C,f}$) for the temperature rise ($\Delta T_C$) of each order of magnitude is calculated according to the following formula:

$$N_{C,f} = B \cdot \Delta T_C^{\beta} \cdot \exp(d/(k_B \cdot T_{C,m}))$$

wherein B, d and ß are parameters determined empirically or by simulation for the respective semiconductor assembly and $k_B = 1.38 \cdot 10^{-23}$ J/K.

10. The method according to claim 1, wherein a rainflow count is carried out on a basis of an expected low-cycle reference load-time curve, by which the frequency of a temperature rise ($\Delta T_{C,ref}$) of a specific order of magnitude is counted for different orders of magnitude for the temperature ($T_{C,ref}$) occurring in the support structure, and a computational determination of a maximum number of load cycles ($N_{C,f,ref}$) for a temperature rise ($\Delta T_{C,ref}$) of each order of magnitude, wherein the second reference value ($LC_{TC,ref}$) is a sum of quotients of the frequency of a temperature rise ($\Delta T_{C,ref}$) of a specific order of magnitude for the temperature ($T_{C,ref}$) occurring in the support structure to the maximum number of load cycles ($N_{C,f,ref}$) for a temperature rise ($\Delta T_{C,ref}$) of a same order of magnitude.

11. The method according to claim 10, wherein an average value ($T_{C,m,ref}$) for the temperature ($T_{C,ref}$) occurring in the support structure is determined from the temperature rise ($\Delta T_{C,ref}$) of a specific order of magnitude for the temperature ($T_{C,ref}$) occurring in the support structure for the respective order of magnitude, and the computational determination of the maximum number of load cycles ($N_{C,f,ref}$) for the temperature rise ($\Delta T_{C,ref}$) of each order of magnitude is calculated according to the following formula:

$$N_{c,f,ref} = B \cdot \Delta T_{C,ref}^{\beta} \cdot \exp(d/(k_B \cdot T_{C,m,ref}))$$

wherein B, d and ß are parameters determined empirically or by simulation for the respective semiconductor assembly and $k_B = 1.38 \cdot 10^{-23}$ J/K.

12. A drive system converter comprising:
a processor;
a semiconductor assembly having at least one semiconductor component; and
a support structure on or in which the at least one semiconductor component is arranged,
wherein the processor is executable to:
  determine a temperature ($T_j$) occurring within the semiconductor component in the form of a time series as a high-cycle load-time curve, to which a first damage characteristic value ($LC_{PC}$) is assigned with the aid of assessment algorithms,
  determine a temperature (Tc) occurring in the support structure in the form of a time series as a low-cyclic load-time curve, to which a second damage characteristic value ($LC_{TC}$) is assigned with the aid of the assessment algorithms, wherein the high-cycle load-time curve and the low-cyclic load-time curve are time-varying thermal loads whose oscillation cycles proceed at different rates, with the oscillation cycles of the high-cycle loads proceeding more rapidly than those of the low-cycle loads,
  for indicating a high-cycle actual operating state range of the semiconductor assembly, assign to the first damage characteristic value ($LC_{PC}$) a non-critical, a critical and a supercritical operating state range for high-cycle loads on the semiconductor assembly by comparing the first damage characteristic value ($LC_{PC}$) with a predetermined first reference value $LC_{PC,ref}$) and
  for indicating a low-cycle actual operating state range of the semiconductor assembly, assign to the second damage characteristic value ($LC_{TC}$) a non-critical, a critical and a supercritical operating state range for low-cycle loads of the semiconductor assembly by comparing the second damage characteristic value ($LC_{TC}$) with a predetermined second reference value ($LC_{TC,ref}$), and
  generate a first indication signal to indicate when both the high-cycle and the low-cycle actual operating state ranges correspond to a non-critical operating state range, generating a second indication signal when the high-cycle or the low-cycle actual operating state range corresponds to a critical operating state range and neither corresponds to a supercritical operating state range, or generating a third indication signal to indicate the high-cycle or the low-cycle actual operating state range corresponds to a supercritical operating state range,
  wherein the time curve of the first reference value ($LC_{PC,ref}$) and of the second reference value ($LC_{TC,ref}$) during operation of the semiconductor assembly is in each case a predetermined, monotonically increasing function which assumes the value 1 when the maximum service life is reached, and
  wherein the processor is further executable to:
    repeat at predetermined time intervals the determination of the first damage characteristic value ($LC_{PC}$) during operation of the driver converter system on a basis of currently determined high-cycle load-time curves and compared with the first reference value ($LC_{PC,ref}$), and
    repeat at predetermined time intervals the determination of the second damage characteristic value ($LC_{TC}$) during operation of the driver converter system on a basis of currently determined low-cycle load-time curves and compared with the second reference value ($LC_{TC,ref}$) to generate in each case an indication signal to indicate the current load state.

13. The drive converter system converter according to claim 12, further comprising visual indicators to which the first, second and third indication signals are transmitted to indicate one of:
- when both the high-cycle and the low-cycle actual operating state ranges correspond to a non-critical operating state range,
- when the high-cycle or the low-cycle actual operating state range corresponds to a critical operating state range and neither corresponds to a supercritical operating state range, or
- when at least one of the high-cycle or the low-cycle actual operating state range corresponds to a supercritical operating state range.

14. The method according to claim 1, wherein the operationally loaded semiconductor assembly comprises a drive system converter.

15. The method according to claim 1, wherein the first, second and third indication signals are transmitted to visual indicators to indicate one of:
- when both the high-cycle and the low-cycle actual operating state ranges correspond to a non-critical operating state range,
- when the high-cycle or the low-cycle actual operating state range corresponds to a critical operating state range and neither corresponds to a supercritical operating state range, or
- when at least one of the high-cycle or the low-cycle actual operating state range corresponds to a supercritical operating state range.

* * * * *